US006973147B2

(12) United States Patent
Christensen et al.

(10) Patent No.: US 6,973,147 B2
(45) Date of Patent: Dec. 6, 2005

(54) TECHNIQUES TO ADJUST A SIGNAL SAMPLING POINT

(75) Inventors: Benny Christensen, Frederikssund (DK); Casper Dietrich, Roskilde (DK); Bjarke Goth, Roskilde (DK); Thorkild Franck, Gentofte (DK); Eivind Johansen, Hoersholm (DK)

(73) Assignee: Intel Corporation, Santa Clara, CA (US)

( * ) Notice: Subject to any disclaimer, the term of this patent is extended or adjusted under 35 U.S.C. 154(b) by 106 days.

(21) Appl. No.: 10/235,291

(22) Filed: Sep. 4, 2002

(65) Prior Publication Data

US 2004/0042578 A1 Mar. 4, 2004

(51) Int. Cl.[7] .............................. H04L 7/00; H03D 3/24
(52) U.S. Cl. ...................... 375/355; 375/354; 375/374
(58) Field of Search ................................ 375/376, 354, 375/355, 371, 373, 374

(56) References Cited

U.S. PATENT DOCUMENTS

| 4,728,194 | A | * | 3/1988 | Mori et al. ................. 356/493 |
| 4,959,617 | A | * | 9/1990 | Martin ......................... 327/12 |
| 4,967,150 | A | * | 10/1990 | Brust .......................... 324/751 |
| 5,151,624 | A | * | 9/1992 | Stegherr et al. ............. 327/356 |
| 5,173,659 | A | * | 12/1992 | Chiba et al. ................. 324/248 |
| 5,432,480 | A | | 7/1995 | Popescu |
| 5,734,675 | A | | 3/1998 | Leonowich |
| 6,222,895 | B1 | * | 4/2001 | Larsson ........................ 375/376 |
| 6,292,485 | B1 | * | 9/2001 | Trotta et al. ................. 370/389 |
| 6,304,622 | B1 | * | 10/2001 | Conradi et al. .............. 375/354 |
| 6,347,128 | B1 | * | 2/2002 | Ransijn ....................... 375/376 |
| 6,389,090 | B2 | * | 5/2002 | Zortea et al. ................ 375/374 |
| 6,392,457 | B1 | * | 5/2002 | Ransijn ....................... 327/156 |
| 6,392,495 | B1 | * | 5/2002 | Larsson ........................ 331/11 |
| 2001/0053161 | A1 | * | 12/2001 | Tomizawa et al. ........... 370/538 |
| 2002/0080830 | A1 | * | 6/2002 | Carson et al. ............... 370/542 |
| 2002/0126690 | A1 | * | 9/2002 | Narayana et al. ............ 370/444 |

FOREIGN PATENT DOCUMENTS

GB        1 355 495        6/1974

OTHER PUBLICATIONS

Alexander, J.D.H., "Clock Recovery from Random Binary Signals", Electronics Letters, vol. 11, No. 22, pp. 541-542, Oct. 30, 1975.
IPEA/US, International Preliminary Examiniation Report for International Application No. PCT/US03/27499, 9 pages, May 17, 2005.

* cited by examiner

Primary Examiner—Chieh M. Fan
Assistant Examiner—Jason M. Perilla
(74) Attorney, Agent, or Firm—Glen B. Choi

(57) ABSTRACT

Techniques to adjust sampling times of an input signal. The techniques may utilize multi-level modification of the phase of a sampling clock. For example, the level of modification of the phase of the sampling clock may depend on the phase angle of the sampling clock in which transitions of the input signal occur.

20 Claims, 8 Drawing Sheets

TECHNIQUES TO ADJUST A SIGNAL SAMPLING POINT

FIELD

This invention generally relates to techniques for adjusting the horizontal sampling point of distorted data signals.

DESCRIPTION OF RELATED ART

Jitter is the general term used to describe distortion caused by short-term deviations of a signal from its ideal timing position. It is desirable to transmit signals having a minimal amount of jitter, but non-ideal components of a communication system inevitably distort the data signal. The distortion may be a deviation in the amplitude, time, or phase of the data signal and may cause errors in the recovery of data within a receiver.

Jitter may be divided into (1) random jitter (which can be caused by unavoidable noise sources within the system) and (2) deterministic jitter (which can be caused by non-ideal data signal transmission and processing). The random jitter component is considered to have a zero-mean gaussian (bell-shaped) distribution, whereas the deterministic jitter component may have both a discrete and a non-symmetric distribution. A conventional receiver may show degraded performance in cases where a non-gaussian jitter distribution is present.

FIGS. 1A–1C depict different examples of (a) transmitted input signals shown in the form of eye-diagrams, (b) clock signals (labeled CLOCK) generated within the receiver and used to sample the received input signals, and (c) associated transition density diagrams of input signal. An eye diagram may represent the phases (i.e., time instances) of signal CLOCK at which transitions of the input signal occur. A transition of the input signal (i.e., a shift from '0' to '1' or from '1' to '0') may be defined as a crossing of the 50% level.

In some current systems, Alexander type phase comparators are used to regenerate the input signal. For a description of Alexander type comparators, see for example Electronic Letters by J. D. H. Alexander in an article entitled, Clock Recovery From Random Binary Signals, Volume 11, page 541–542, October 1975. In some systems, Alexander type comparators align the 180 degree phase of the CLOCK signal with the peak or the mean of the transition distribution and sample the input signal at each zero (0) degree phase of the CLOCK signal. Such samples of the input signal can be used to regenerate the input signal.

FIG. 1A depicts a so-called "open eye" scenario with a non-return to zero (NRZ) input signal in which transitions of the input signal occur primarily within a narrow phase region (shown as region T). The transition distribution curve shows that transitions of the input signal occur primarily within a narrow phase region. When the 180 degree phase of the signal CLOCK is aligned with the peak of the transition distribution, the zero (0) degree phase of signal CLOCK may be used to sample the input signal.

FIG. 1B depicts a distorted NRZ signal and a so-called "closed eye" scenario in which transitions of the input signal occur over a wide range of phases of signal CLOCK. Accordingly, the eye diagram of the input signal reveals a small region in which transitions do not occur. In this scenario, phase comparisons may indicate that transitions of the input signal frequently occur outside of region T. Region T may represent a region of contained transition distribution of the input signal. In this scenario, samples of the input signal taken at phase S may be taken when transitions of the input signal occur. If samples of the input signal are taken at phase S, the input signal may be improperly sampled.

FIG. 1C depicts an asymmetric return to zero (RZ) signal scenario in which transitions of the input signal occur with a discrete distribution of phases of signal CLOCK. In this scenario, phase comparisons may indicate that the transition distribution of the input signal has several peaks with one peak at the center of region T. Furthermore, one of the edges of the input signal may be steeper and more well-defined than the opposite 'blurred' transition as depicted by the transition distribution function. In this scenario, the 180 degree phase of signal CLOCK may be aligned with one of the peaks of the transition distribution, and samples of the input signal taken at phase S may be made at a time when the "eye" is not completely open. Accordingly, samples of the input signal may be inaccurate.

BRIEF DESCRIPTION OF THE DRAWINGS

Note that use of the same reference numbers in different figures indicates the same or like elements.

DETAILED DESCRIPTION

Figure 1A:
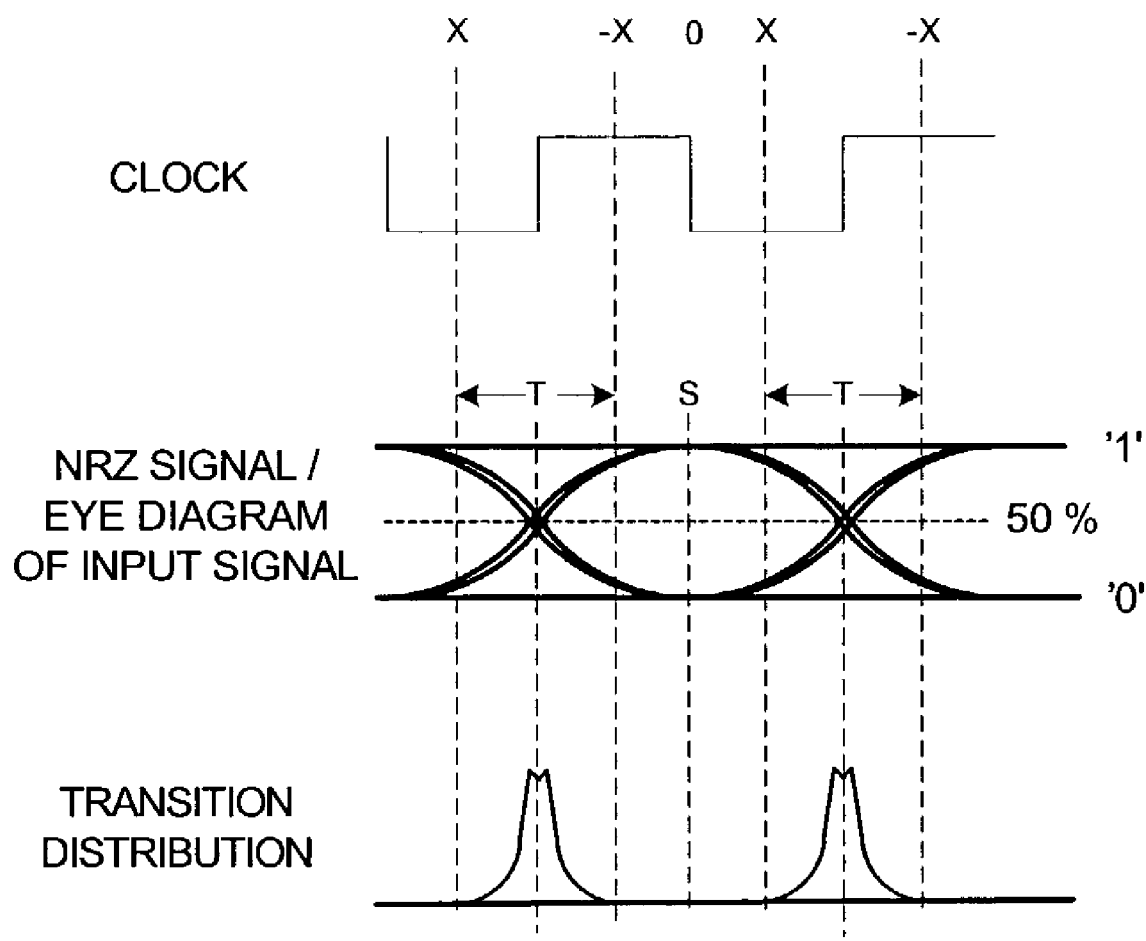
FIGS. 1A–1C depict examples of a clock signal, an input signal, as well as associated transition density diagrams.
Figure 1B:
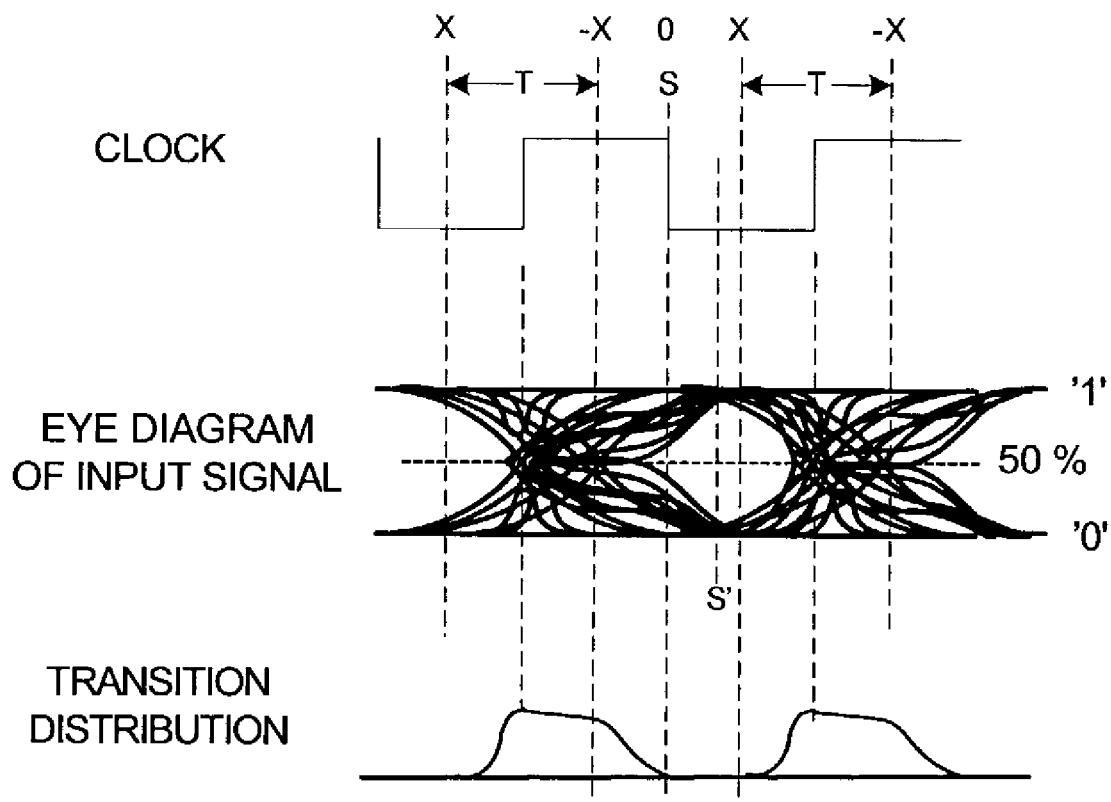
Figure 1C:
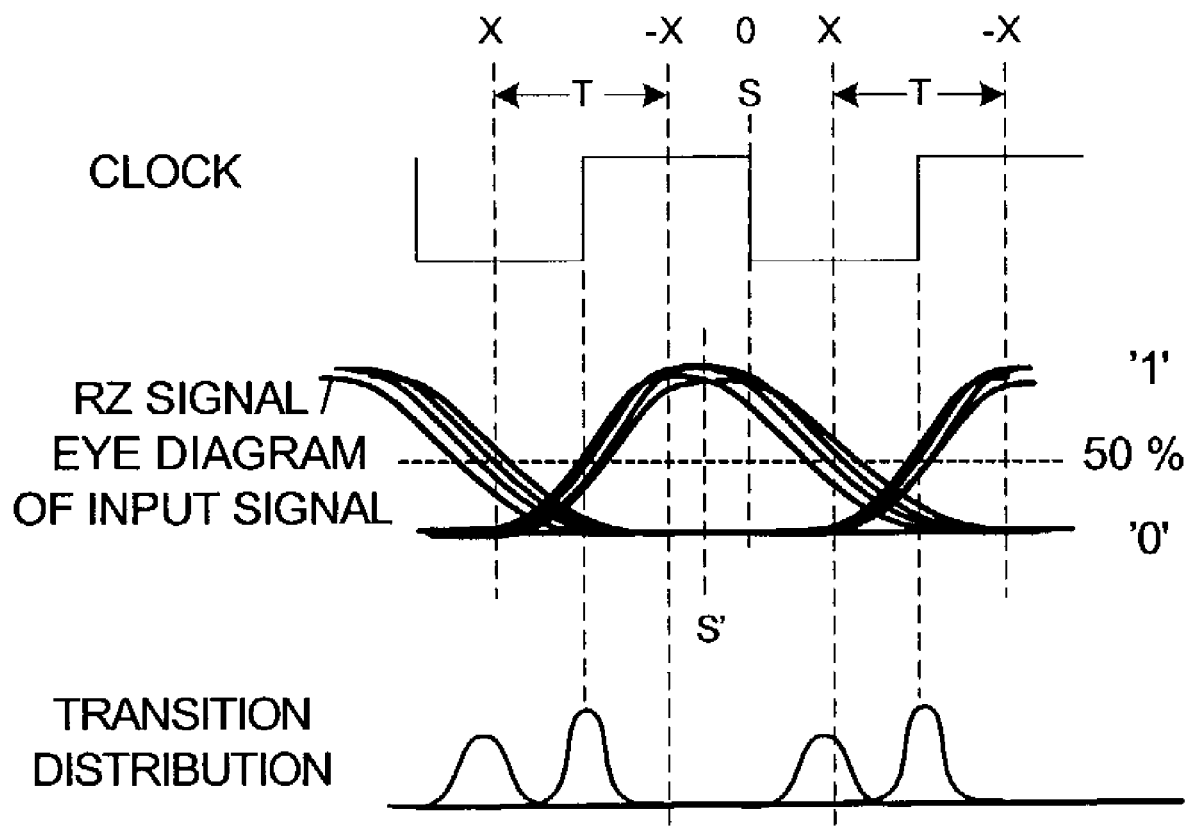
Figure 2:
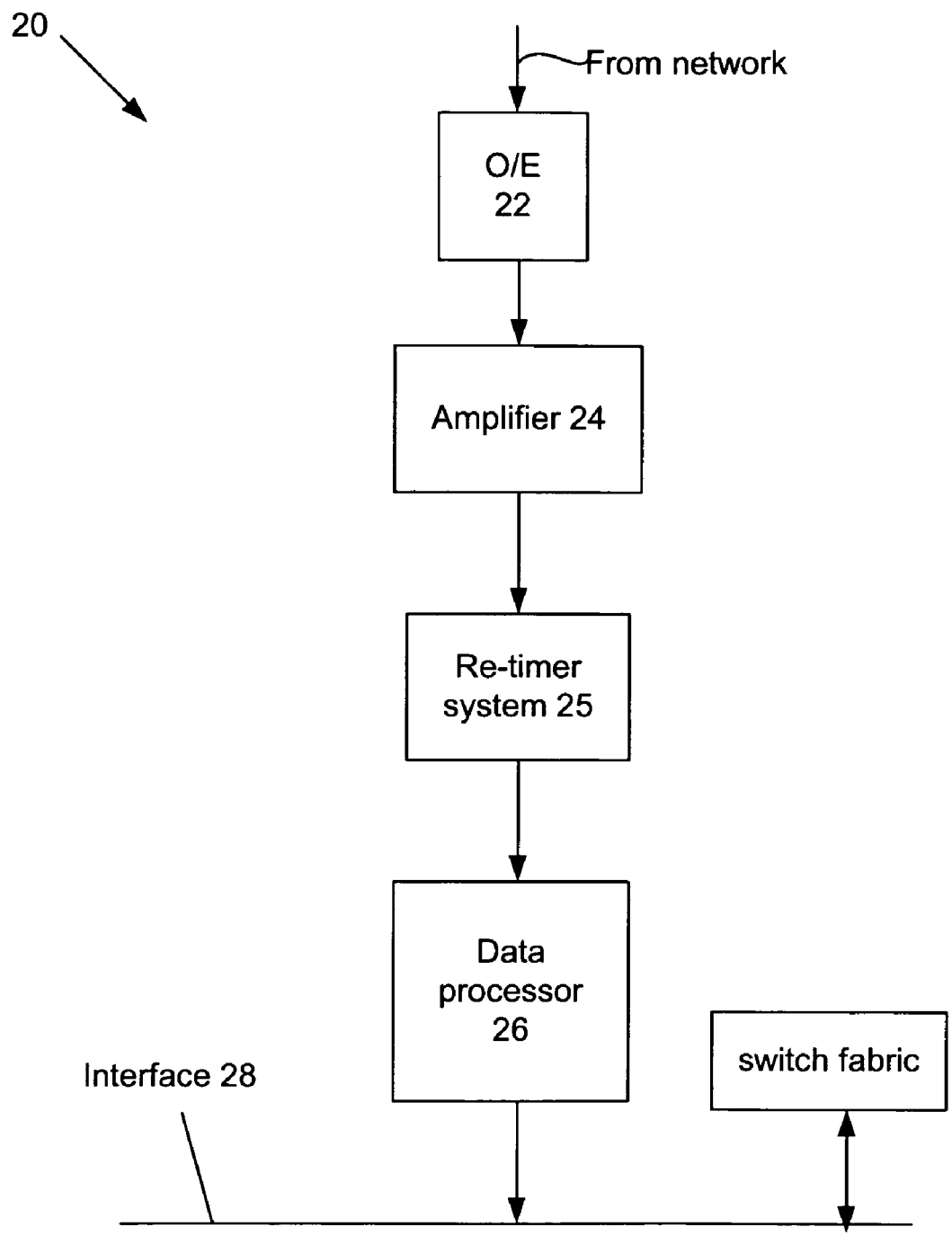
FIG. 2 depicts an example of a receiver system that may use some embodiments of the present invention.

For example, FIG. 2 depicts an example receiver system 20 that may use some embodiments of the present invention. Optical-to-electrical converter ("O/E") 22 may convert optical signals received from an optical network into electrical signals. Although reference has been made to optical signals, the receiver 20 may, in addition or alternatively, receive electrical signals from an electrical signal network. Amplifier 24 may amplify the electrical signals. Re-timer system 25 may, in accordance with an embodiment of the present invention, adjust phases of a clock signal used to sample and reproduce an input signal. Re-timer system 25 may also regenerate electrical signals using the samples. On the regenerated signals, layer two processor 26 may perform media access control (MAC) management in compliance for example with Ethernet, described for example in versions of IEEE 802.3; optical transport network (OTN) de-framing and de-wrapping in compliance for example with ITU-T G.709; forward error correction (FEC) processing, in accordance with ITU-T G.975; and/or other layer 2 processing. Interface 28 may provide intercommunication between layer two processor 26 and other devices such as a switch fabric. Interface 28 may be compliant, for example, with a vendor specific multi-source agreement (MSA) protocol. The examples described with respect to FIG. 1 by no means limit the systems in which some embodiments of the present invention may be used. For example, receiver 20 may be adapted to receive wireless or wire-line signals according to any standards.

Figure 3:
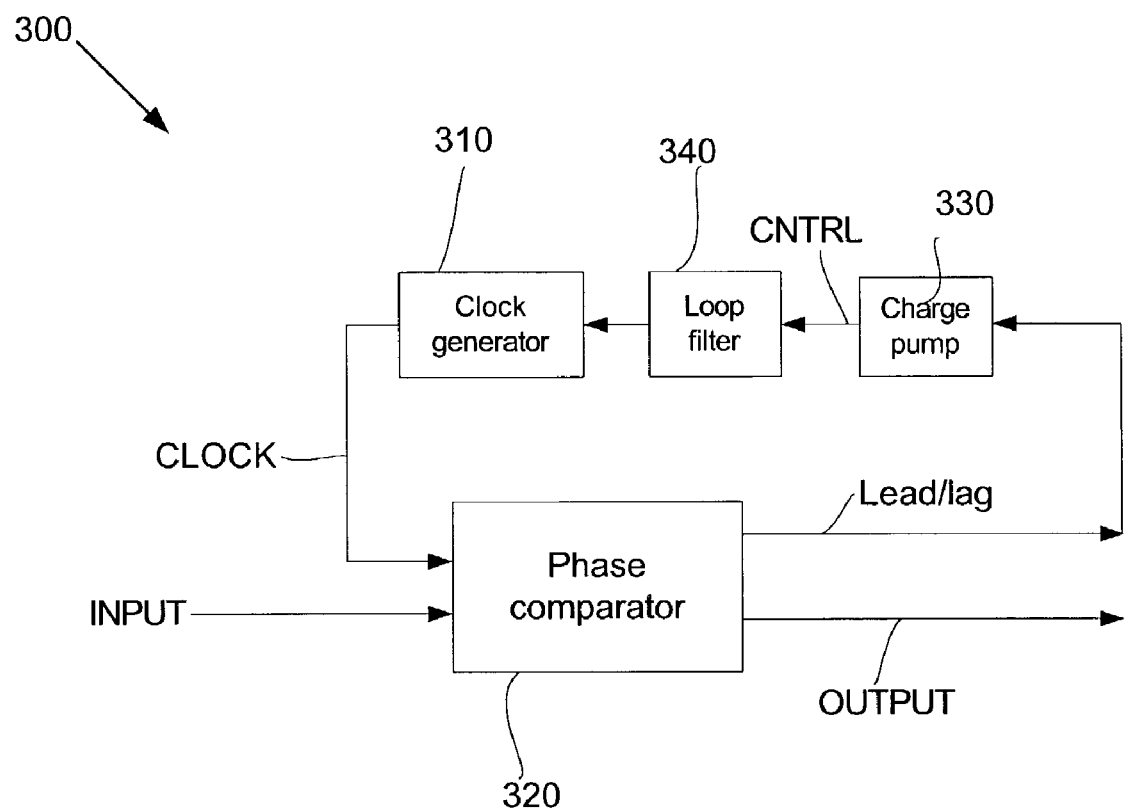
FIG. 3 depicts in block diagram form an embodiment of the present invention in a sampling phase adjuster.

FIG. 3 depicts in block diagram form an embodiment of the present invention in sampling phase adjuster 300. Sampling phase adjuster 300 may adjust a sampling phase of an input signal (shown as signal INPUT) so that samples of signal INPUT may be accurately made. In accordance with an embodiment of the present invention, sampling phase adjuster 300 may adjust the sampling phase (e.g., zero (0) degree phase) of signal CLOCK to a phase angle where transitions of signal INPUT are less likely to occur.

For example, in the scenarios depicted in FIGS. 1B and 1C, the sampling phase of signal CLOCK (phase S) corresponds to a phase where transitions of signal INPUT are likely to occur. In this example, in accordance with an embodiment of the present invention, sampling phase adjuster 300 may adjust the sampling phase of signal CLOCK from S to S'. Phase S' may correspond to a phase where transitions of signal INPUT are less likely to occur than phase S and where the "eye-opening" may be largest (i.e., the phase in the eye diagram where the difference in magnitude between "1" and "0" values may be greatest).

One implementation of sampling phase adjuster 300 may include a clock generator 310, phase comparator 320, charge pump 330, and loop filter 340. Clock generator 310 may output a clock signal (shown as CLOCK). Clock generator 310 may adjust the phase of signal CLOCK based on control signal CNTRL. Clock generator 310 may be implemented as a voltage controlled oscillator (VCO) or voltage-controlled crystal oscillator (VCXO) although other oscillators may be used.

Phase comparator 320 may output samples of signal INPUT (such output samples are shown as signal OUTPUT) timed according to signal CLOCK. In one implementation, phase comparator 320 may sample signal INPUT at zero (0) degree phases of the signal CLOCK, although other phase angles may be used. In addition, phase comparator 320 may provide a signal (shown as lead/lag) to move the sampling phase of signal CLOCK. In one embodiment of the present invention, phase comparator 320 may move the sampling phase of signal CLOCK more when a transition of signal INPUT occurs within phase angles of signal CLOCK approximately between |±X| and 0 than when a transition of signal INPUT occurs within phase angles of signal CLOCK approximately between |±180| and |±X|. The value X may correspond to a phase angle of signal CLOCK where if transitions of signal INPUT approximately occur, the signal INPUT may have properties of a closed eye (such as described with respect to FIGS. 1B and 1C). A larger value of X may be chosen when a smaller transition region is desired. For example, in one implementation, the value X may be approximately 90 degrees although other values may be used.

Figure 4:
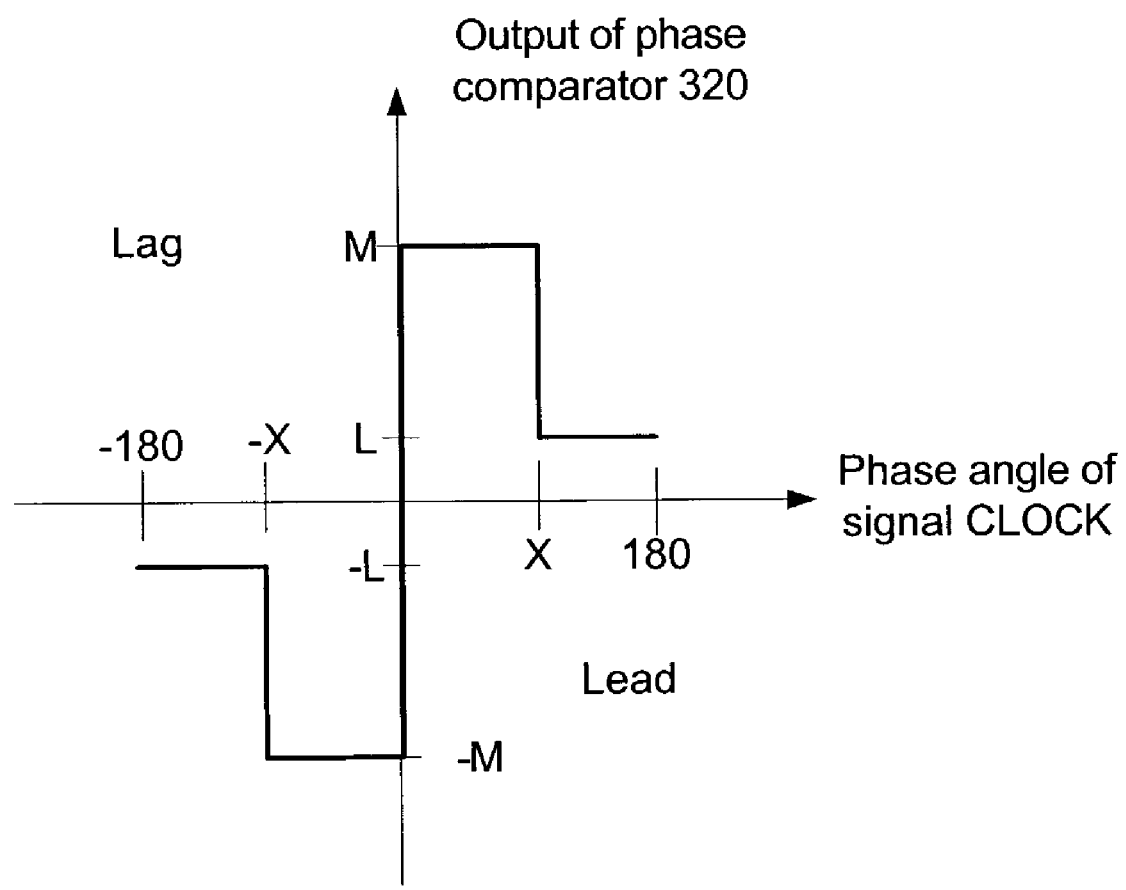
FIG. 4 depicts a sample transfer function of a phase comparator in accordance with an embodiment of the present invention.

For example, FIG. 4 depicts a sample transfer function of a phase comparator 320 for a sampling phase of zero degrees and transition alignment at 180 degrees, in accordance with an embodiment of the present invention. In this example, if a transition of signal INPUT occurs among phase angles of signal CLOCK approximately between −180 and −X, phase comparator 320 may output signal lead/lag having a magnitude of −L to slow signal CLOCK by a phase amount proportional to L (which may correspond to a state where the signal INPUT lags the signal CLOCK). In this example, if a transition of signal INPUT occurs among phase angles of signal CLOCK approximately between −X and 0, phase comparator 320 may output signal lead/lag having a magnitude of −M, where M>L, to slow signal CLOCK by a phase amount proportional to M (which may correspond to a state where the signal INPUT lags the signal CLOCK).

In this example, if a transition of signal INPUT occurs among phase angles of signal CLOCK approximately between X and 180 degrees, phase comparator 320 may output signal lead/lag having a magnitude of L to speed signal CLOCK by a phase amount proportional to L (which may correspond to a state where the signal INPUT leads the signal CLOCK). In this example, if a transition of signal INPUT occurs among phase angles of signal CLOCK approximately between 0 and X degrees, phase comparator 320 may output signal lead/lag having a magnitude of M, where M>L, to speed signal CLOCK by a phase amount proportional to M (which may correspond to a state where the signal INPUT leads the signal CLOCK).

Figure 5:
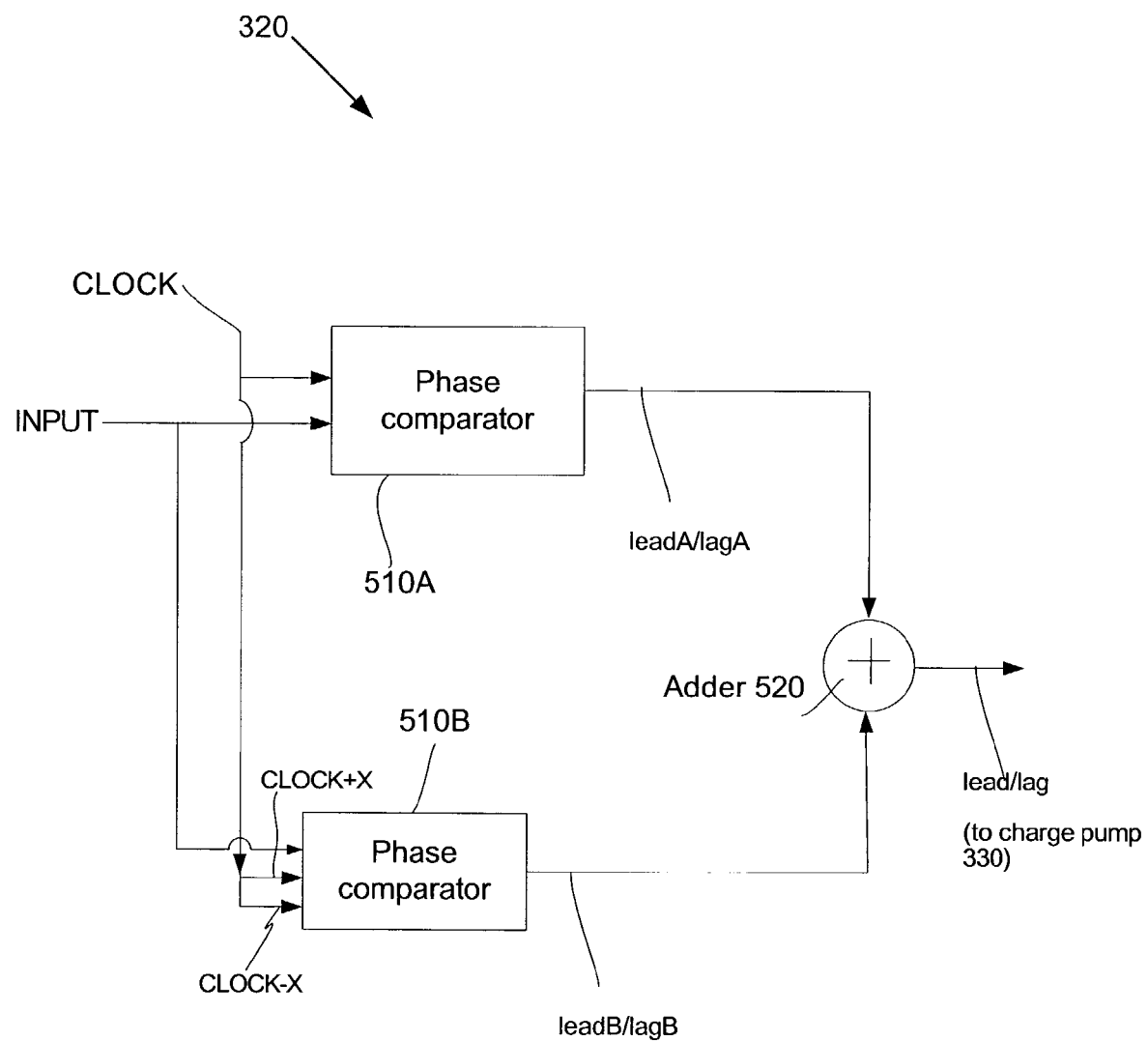
FIG. 5 depicts an example implementation of a phase comparator in accordance with an embodiment of the present invention.
Figure 6:
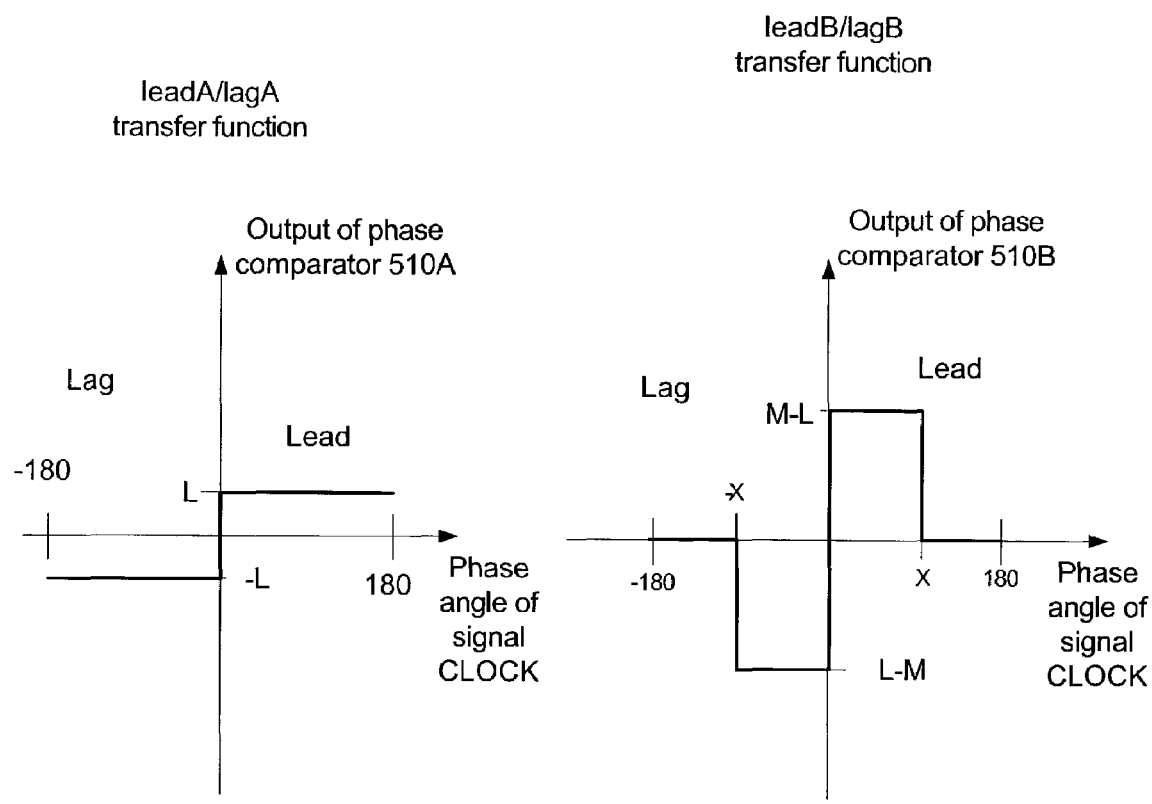
FIG. 6 depicts example transfer functions of leadA/lagA and leadB/lagB that phase comparators may implement, in accordance with an embodiment of the present invention.

FIG. 5 depicts an example implementation of phase comparator 320 in accordance with an embodiment of the present invention. Phase comparator 320 may include phase comparators 510A and 510B and adder 520. For example, FIG. 6 depicts example transfer functions of signals leadA/lagA and leadB/lagB that respective phase comparators 510A and 510B may implement.

For 0, 180, and −180 degree phase angles of signal CLOCK, phase comparator 510A may compare the transitions of signal INPUT with transitions of a signal CLOCK and indicate whether the transitions of the signal INPUT lead or lag those of signal CLOCK (such output shown as leadA/lagA). Herein, signal CLOCK−X may represent a version of signal CLOCK phase shifted by −X degrees. Herein, signal CLOCK+X may represent a version of signal CLOCK phase shifted by +X degrees. For X and −X degree phase angles of signal CLOCK, phase comparator 510B may compare the transitions of signal INPUT with transitions of respective signals CLOCK+X and CLOCK−X and indicate whether the transitions of the signal INPUT lead or lag transitions of respective signals CLOCK+X and CLOCK−X (such output shown as leadB/lagB). The signal lead/lag (having a transfer function depicted in FIG. 4) may represent a sum of signals leadA/lagA and leadB/lagB.

Each of phase comparators 510A and 510B may be implemented as Alexander ("bang-bang") type circuits. One possible implementation of an Alexander phase detector is described in Electronic Letters by J. D. H. Alexander in an article entitled, Clock Recovery From Random Binary Signals, Volume 11, page 541–542, October 1975.

Phase comparators 510A and 510B may output signals leadA/lagA and leadB/lagB to adder 520. Adder 520 may sum signals leadA/lagA and leadB/lagB and provide the sum as signal lead/lag to charge pump 330 (FIG. 3).

Referring to FIG. 3, charge pump 330 may receive signal lead/lag from phase comparator 320. Charge pump 330 may add or remove charge from clock generator 310 in an amount in proportion to the sign (positive or negative) and magnitude of signal lead/lag. Charge pump 330 may output signal CNTRL that instructs the clock generator 310 to either increase or decrease the speed of signal CLOCK. For example, if charge pump 330 receives a lead indicator, signal CNTRL may correspond to charge addition to the clock generator 310 to increase the speed of the signal CLOCK. Conversely, if charge pump 330 receives a lag indicator, signal CNTRL may correspond to removal of charge from the clock generator 310 to decrease the speed of the signal CLOCK.

Loop filter 340 may transfer signal CNTRL to clock generator 310 when the frequency of signal CNTRL is within the pass band of the loop filter 340. Clock generator 310 may receive the transferred portion of the sum of signal CNTRL. Although a charge pump and loop filter combination is provided as an example implementation, other devices may be used to selectively transfer signal CNTRL to the clock generator 310.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method comprising:
providing a phase comparison output between logical transitions of first and second signals,
wherein the phase comparison output is greater in magnitude for a phase difference between the first signal respective to the second signal between 0 and X degrees than for a phase difference between the first signal respective to the second signal that occurs between X and 180 degrees, wherein the phase comparison output for the phase difference between the first signal respective to the second signal that occurs between 0 and X degrees is non-zero and of constant magnitude, and the phase comparison output for the phase difference between the first signal respective to the second signal that occurs between X and 180 degrees is non-zero and of constant magnitude,
wherein the phase comparison output is greater in magnitude for a phase difference between the first signal respective to the second signal between 0 and −X degrees than for a phase difference between the first signal respective to the second signal that occurs between −X and −180 degrees, wherein the phase comparison output for the phase difference between the first signal respective to the second signal that occurs between 0 and −X degrees is non-zero and of constant magnitude, and the phase comparison output for the phase difference between the first signal respective to the second signal that occurs between −X and −180 degrees is non-zero and of constant magnitude,
wherein X is a positive real number;
selectively adjusting a phase of the second signal based upon the phase comparison output; and
sampling the first signal based upon the second signal.

2. The method of claim 1, wherein the selectively adjusting comprises adjusting the phase of the second signal by an amount in proportion to the magnitude of the phase comparison output.

3. The method of claim 1, wherein X is approximately 90 degrees.

4. The method of claim 1, wherein between X and 180 degrees comprises a phase region of the second signal respective to a phase of the first signal in which transitions of the first signal primarily occur and wherein between −X and −180 degrees comprises a phase region of the second signal respective to a phase of the first signal in which transitions of the first signal primarily occur.

5. The method of claim 1, wherein the selectively adjusting comprises adjusting the phase of the second signal based upon the magnitude and sign of the phase comparison output.

6. An apparatus comprising:
a phase comparator to compare phases of first and second signals, and to provide a phase comparison output,
wherein the phase comparison output is greater in magnitude for a phase difference between the first signal respective to the second signal between 0 and X degrees than for a phase difference between the first signal respective to the second signal between X and 180 degrees, wherein the phase comparison output for the phase difference between the first signal respective to the second signals that occurs between 0 and X degrees is non-zero and of constant magnitude, and the phase comparison output for the phase difference between the first signal respective to the second signal that occurs between X and 180 degrees is non-zero and of constant magnitude,
wherein the phase comparison output is greater in magnitude for a phase difference between the first signal respective to the second signal between 0 and X degrees than for a phase difference between the first signal respective to the second signal between −X and −180 degrees, wherein the phase comparison output for the phase difference between the first signal respective to the and second signal that occurs between 0 and −X degrees is non-zero and of constant magnitude, and the phase comparison output for the phase difference between the first signal respective to the second signal that occurs between −X and −180 degrees is non-zero and of constant magnitude,
wherein X is a positive real number, and
wherein the phase comparator is to sample the first signal based upon the second signal;
a charge pump to receive the phase comparison output and to provide a control signal based upon the phase comparison output;
a filter to integrate the control signal and to provide an instruction to adjust the phase of the second signal based upon the integration; and
a second signal source to output the second signal, wherein the second signal source is to selectively adjust the phase of the second signal based upon the instruction.

7. The apparatus of claim 6 wherein the phase comparator further comprises:
a first phase comparator to compare phases of the first and second signals at approximately 0, 180, and 180 degree phase angles and to provide a first phase comparison;
a second phase comparator to compare phases of the first and second signals at approximately X and −X degree phase angles and to provide a second phase comparison; and
an adder to sum the first and second phase comparisons and, based upon the sum, to provide the phase comparison output to the charge pump.

8. The apparatus of claim 7, wherein the first phase comparator comprises an Alexander-type phase comparator.

9. The apparatus of claim 7, wherein the second phase comparator comprises an Alexander-type phase comparator.

10. A system comprising:
an amplifier to receive a first signal and to amplify the first signal;
a phase comparator to compare phases between the first signal and a second signal, and to provide a phase comparison output,
wherein the phase comparison output is greater in magnitude for a phase difference between the first signal respective to the second signal between 0 and X degrees than for a phase difference between the first signal respective to the second signal between X and 180 degrees, wherein the phase comparison output for the phase difference between the first signal respective to the second signal that occurs between 0 and X is non-zero and of constant magnitude, and the phase comparison output for the phase difference between the first signal respective to the second signals that occurs between X and 180 is non-zero and of constant magnitude, wherein the phase comparison output is greater in magnitude for a phase difference between the first signal respective to the second signal between 0 and −X degrees than for a phase difference between the first signal respective to the second signals between −X and −180 degrees, wherein the phase comparison output for the phase difference between the first signal respective to the second signal that occurs between 0 to −X degrees is non-zero and of constant magnitude, wherein the phase comparison output for the phase difference between the first signal respective to the second signal that occurs between −X and −180 degrees is non-zero and of constant magnitude, wherein X is a positive real number, and wherein the phase comparator is to sample the first signal based upon the second signal;

a second signal source to output the second signal, wherein the second signal source is to selectively adjust the phase of the second signal based upon the phase comparison output; and a layer two processor to receive samples of the first signal.

11. The system of claim 10, further comprising:

an optical-to-electrical converter to convert an optical signal into an electrical signal and provide the electrical signal to the amplifier as the first signal.

12. The system of claim 10, wherein the layer two processor comprises logic to perform media access control in compliance with IEEE 802.3.

13. The system of claim 10, wherein the layer two processor comprises logic to perform optical transport network de-framing in compliance with ITU-T G.709.

14. The system of claim 10, wherein the layer two processor comprises logic to perform optical transport network de-wrapping in compliance with ITU-T G.709.

15. The system of claim 10, wherein the layer two processor comprises logic to perform forward error correction processing in compliance with ITTJ-T G.975.

16. The system of claim 10, further comprising an interface to receive signals from the layer two processor and provide signals to the layer two processor.

17. The system of claim 16, further comprising a switch fabric coupled to the interface.

18. A method comprising:

providing a phase comparison output between transitions of first and second signals, wherein the phase comparison output is greater in magnitude for a phase difference between the first signal respective to the second signal that occurs between 0 and X degrees than for a phase difference between the first signal respective to the second signal that occurs between X and 180 degrees, wherein the phase comparison output for the phase difference between the first signal respective to the second signal that occurs between 0 and X degrees is non-zero and of constant magnitude, and the phase comparison output for the phase difference between the first signal respective to the second signal that occurs between X and 180 degrees is non-zero and of constant magnitude, wherein the phase comparison output is greater in magnitude for a phase difference between the first signal respective to the second signal between 0 and −X degrees than for a phase difference between the first signal respective to the second signals that occurs between −X and −180 degrees, wherein the phase comparison output for the phase difference between the first signal respective to the second signal that occurs between 0 and −X degrees is non-zero and of constant magnitude, and the phase comparison output for the phase difference between the first signal respective to the second signal that occurs between −X and −180 degrees is non-zero and of constant magnitude, and wherein X is a positive real number.

19. The method of claim 18, wherein X is approximately 90.

20. The method of claim 18, wherein between X and 180 degrees comprises a phase region of the second signal respective to a phase of the first signal in which transitions of the first signal primarily occur and wherein between −X and −180 degrees comprises a phase region of the second signal respective to a phase of the first signal in which transitions of the first signal primarily occur.

* * * * *

UNITED STATES PATENT AND TRADEMARK OFFICE
CERTIFICATE OF CORRECTION

PATENT NO. : 6,973,147 B2
DATED : December 6, 2005
INVENTOR(S) : Christensen et al.

It is certified that error appears in the above-identified patent and that said Letters Patent is hereby corrected as shown below:

Column 6,
Line 43, after "and" delete "180" and insert -- –180 --.

Column 7,
Line 44, delete "ITTJ-T" and insert -- ITU-T --.

Signed and Sealed this

Twenty-fifth Day of April, 2006

JON W. DUDAS
*Director of the United States Patent and Trademark Office*